(12) United States Patent
Ricca

(10) Patent No.: US 6,870,384 B1
(45) Date of Patent: Mar. 22, 2005

(54) TEST INSTRUMENT WITH MULTIPLE ANALOG MODULES

(75) Inventor: Paolo Dalla Ricca, Fremont, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 10/884,836

(22) Filed: Jul. 2, 2004

(51) Int. Cl.[7] .................. G01R 31/02; G01R 31/26
(52) U.S. Cl. .................................. 324/763; 324/765
(58) Field of Search .................. 324/73.1, 763, 324/765, 158.1; 714/724, 729, 733–736

(56) References Cited

U.S. PATENT DOCUMENTS

| | | | | |
|---|---|---|---|---|
| 5,173,904 A | * | 12/1992 | Daniels et al. ............. 714/729 |
| 5,379,308 A | * | 1/1995 | Nhuyen et al. ............. 714/734 |
| 5,717,329 A | * | 2/1998 | Lee .......................... 324/158.1 |
| 5,731,701 A | * | 3/1998 | Lee .......................... 324/158.1 |
| 6,483,338 B2 | * | 11/2002 | Weng et al. ................. 324/765 |

* cited by examiner

Primary Examiner—Minh N. Tang
(74) Attorney, Agent, or Firm—Moser Patterson & Sheridan, LLP

(57) ABSTRACT

An analog test instrument used in an apparatus for testing electronic devices has multiple analog modules for supplying test signals to analog pins of a device under test and receiving response signals from the analog pins. The analog modules may be of the same type or of different types. The analog test instrument also has programmable devices that control in an independent manner the triggering, clocking, and generation of the test signals supplied by each of the analog modules, so that test signals of various timings, speeds and waveforms may be generated.

20 Claims, 7 Drawing Sheets

310

FIG. 6A
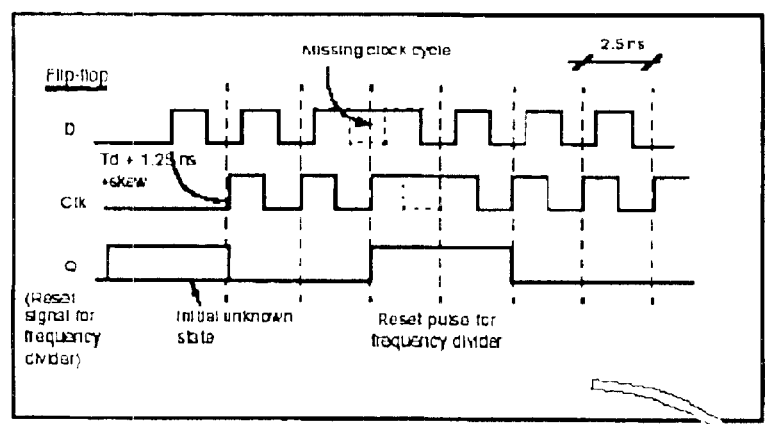
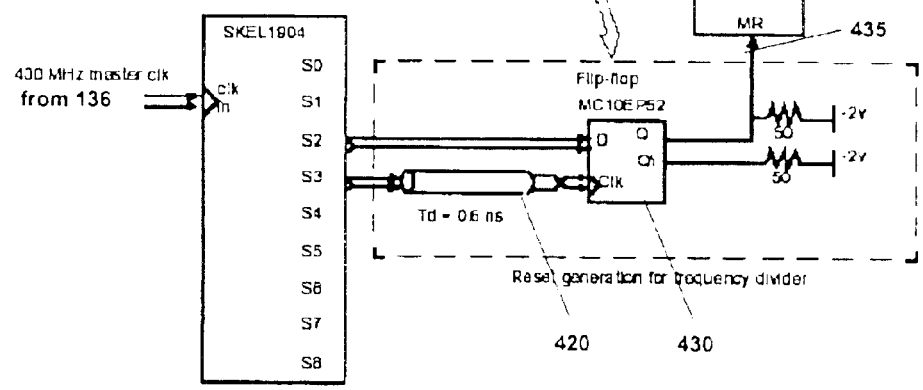
FIG. 6B

TEST INSTRUMENT WITH MULTIPLE ANALOG MODULES

BACKGROUND OF THE INVENTION

1. Field of the Invention

The present invention relates generally to electronic device testing, and more particularly, to integrated circuit (IC) testing using analog test instruments.

2. Description of the Related Art

Today's SOC (System On a Chip) ICs implement in a single device functions that used to be supported in a chip set. As a result, a single IC device is likely to have both analog and digital functionalities, including audio and video signal generation and acquisition, digital signal processing, and high speed serial interfaces. The testing of these devices requires both digital instruments for testing digital pins and analog instruments for testing analog pins.

SUMMARY OF THE INVENTION

The invention provides an analog test instrument that is capable of simultaneously testing multiple analog pins of a device under test. The analog test instrument includes multiple analog modules for supplying test signals to the analog pins and receiving response signals from the analog pins. The analog test instrument also includes programmable devices that supply data and clock signals to each of the analog modules in an independent manner so that test signals can be generated by each of the analog modules in an independent manner.

The analog modules, the programmable devices and components that provide infrastructure services to the analog modules and the programmable devices are mounted on a motherboard. The motherboard is generic in that analog modules of different types may be mounted in the sections reserved for the analog modules.

The invention is useful in a number of potential applications. First, an SOC IC requiring the testing of both digital and analog pins has many more digital pins to be tested than analog pins. A typical digital pin to analog pin ratio is 100:1. As a result, in a given test apparatus, the number of digital test instruments far outnumbers analog test instruments, and the number of analog test instruments available for testing is limited. The analog test instrument according to the invention provides testing flexibility in such test environments because it can test one analog pin independently from the others.

Second, the testing of analog pins of SOC ICs typically involves structural testing, which allows testing of pins to be carried out at the same time even though they might have different dynamic features. With the invention, this type of testing can be performed efficiently because: (i) up to four analog pins may be tested with a single instrument; (ii) testing of the four analog pins with a single instrument is carried out such that each analog pin is tested independently with respect to the other three, and (iii) analog modules for testing analog pins with different dynamic features may be mounted in a single instrument.

A third potential application is multi-site testing, where multiple samples of the same device are tested simultaneously by the same test program in different threads. With the invention, a single instrument can handle multiple threads because the testing of each analog pin is carried out independently with respect to the others.

A fourth potential application is analog pin testing that requires very tight synchronization. With the invention, the clocks of the four independent modules are derived from a common source that is fully synchronous and phase aligned with the rest of the system. As a result, the clocks of the four independent modules are fully synchronized and phase aligned with each other as well as with the rest of the system, and permit generation of test signals that are very closely matched in phase.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 6A illustrates a reset signal supplied to a clock divider implemented in the analog instrument of FIG. 2;

FIG. 6B is a block diagram of a circuit that generates the reset signal of FIG. 6A.

DETAILED DESCRIPTION

Figure 1:
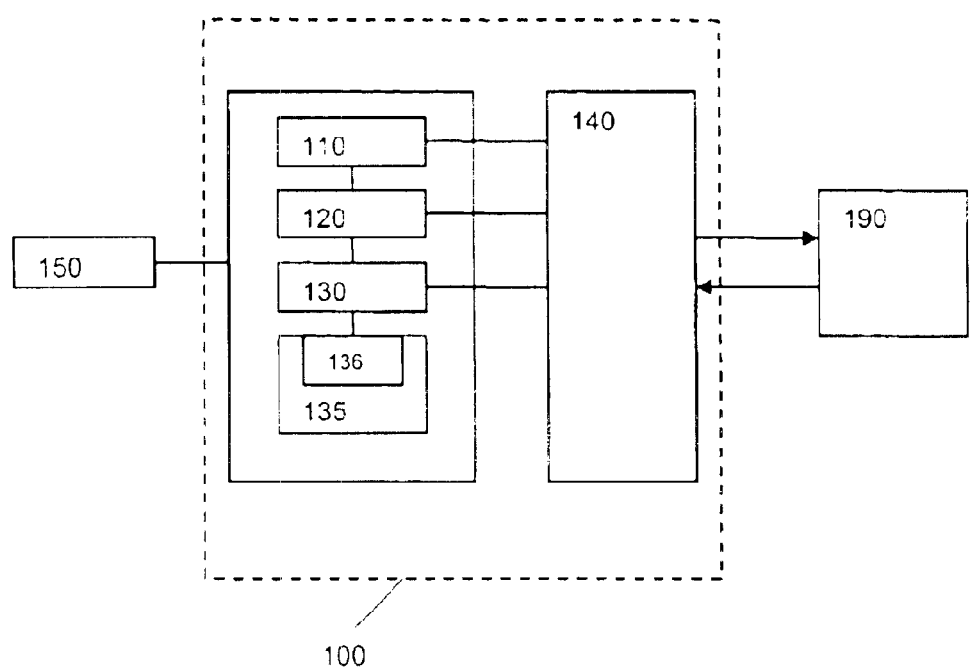
FIG. 1 is a block diagram of a tester and a device under test.

FIG. 1 is a block diagram of a tester 100 that is used in testing electronic devices. The tester 100 includes a number of slots in which a number of instruments are inserted. The instruments include a device power supply (DPS) 110 for supplying power to a device under test (DUT) 190, analog test instruments 120 for supplying test signals to analog pins of the DUT 190 and receiving response signals from the analog pins, digital test instruments 130 for supplying test signals to digital pins of the DUT 190 and receiving response signals from the digital pins, a test head interface 135 which houses a master clock 136, and a fixture 140, known in the art as a loadboard, for providing a connection interface between the instruments 110, 120, 130 and the DUT 190. During testing, the tester 100 operates under the control of software, e.g., a test program 150. The bus architecture of the tester 100 by which the instruments 110, 120, 130, 135 communicate with each other, and other details of the tester 100, are described in U.S. patent application Ser. No. 10/222,191, entitled "Circuit Testing with Ring-Connected Test Instrument Modules," filed Aug. 16, 2002, which is incorporated by reference herein.

Figure 2:
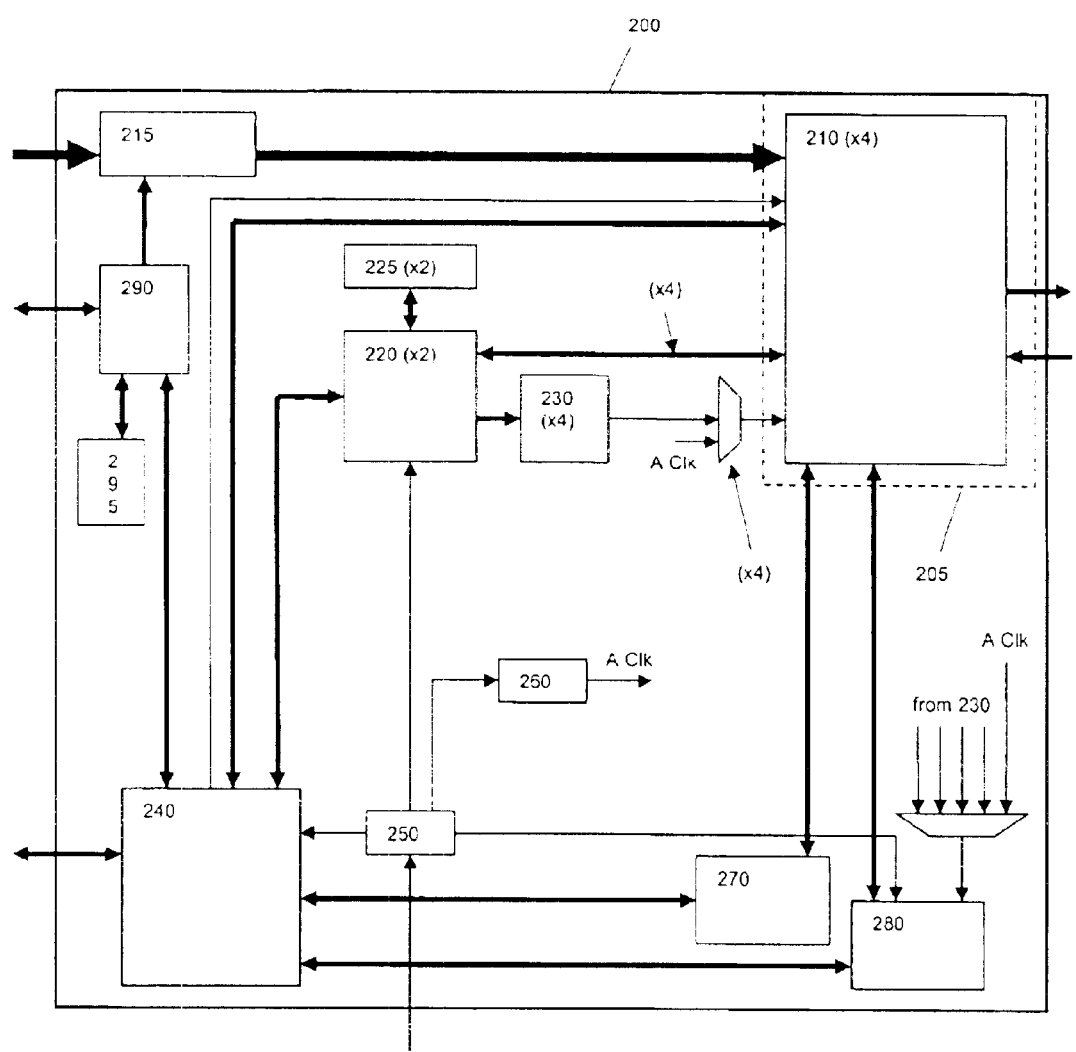
FIG. 2 is a block diagram of an analog instrument used in the tester of FIG. 1.

FIG. 2 is a block diagram of an analog instrument according to an embodiment of the invention. The analog instrument includes a motherboard 200 that can be used in conjunction with different types of analog pin electronics (APE) modules. Three examples of APE modules that may be used include: (i) a QBIX module, which includes four integrated transceiver channels, each of which has a frequency range up to 100 MHz; (ii) a UHF-AWG module, which includes an ultra-high frequency arbitrary waveform generator; and (iii) a MIX module, which is like the QBIX module but with lower performance (lower frequency range) and higher channel count (up to sixteen integrated transceiver channels). The QBIX module is described in further detail in U.S. patent application Ser. No. 10/366,839, entitled "Programmable Multi-Function Module for Automatic Test Equipment Systems," filed Feb. 13, 2003, and U.S. patent application Ser. No. 10/367,389, entitled "Programmable Digital Interface for Analog Test Equipment Systems," filed Feb. 13, 2003, both of which are incorporated by reference herein.

In the preferred embodiment, the motherboard 200 has four sections 205 (only one of which is shown), in which APE modules 210-1, 210-2, 210-3, 210-4 (collectively referred to as 210) can be mounted. Each of the APE modules 210 interfaces with one analog pin of the DUT 190. The motherboard 200 also includes a power module 215, a pair of field programmable gate arrays (FPGAs) 220-1, 220-2 (collectively referred to as 220) and associated memories 225-1, 225-2 (collectively referred to as 225), four digital clock generators 230-1, 230-2, 230-3, 230-4 (collectively referred to as 230), a bus interface FPGA 240, a clock divider 250, an analog clock 260, a parametric measurement unit (PMU) 270, a time measurement unit (TMU) 280, a system monitoring FPGA 290, and a system monitoring EEPROM 295.

The components of the analog instrument function together to generate test signals for the analog pins of the DUT 190 through the APE modules 210 and receive response signals from the analog pins of the DUT 190 through the APE modules 210. The interconnections of these components are illustrated in FIG. 2. The thick lines signify supply of power from the power module 215 (for simplicity, only one such connection from the power module 215 is shown). The medium thick lines signify supply of data and control signals. The thin lines signify supply of clock signals.

Figure 3:
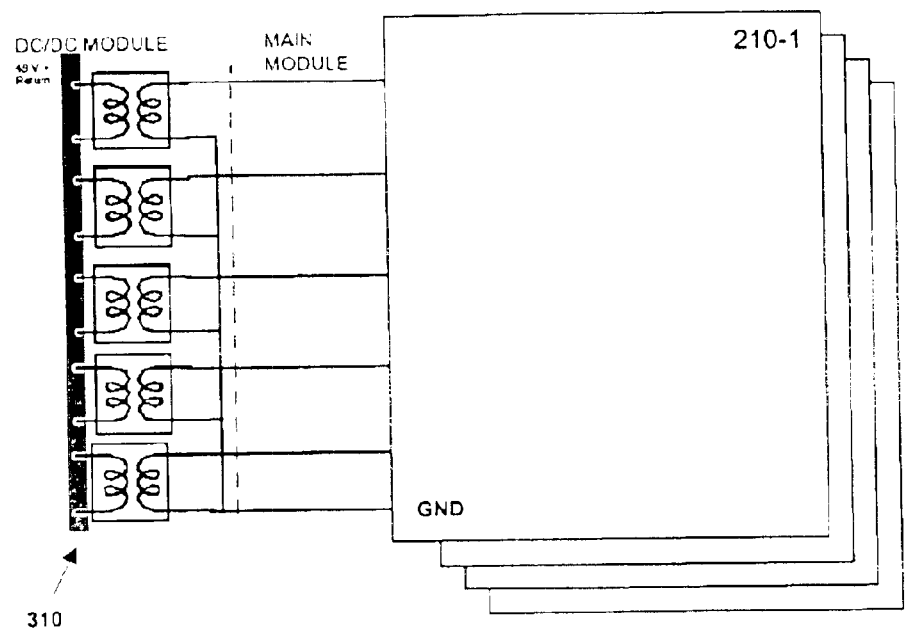
FIG. 3 is a block diagram showing power supplied to an analog module mounted in the analog instrument of FIG. 2.

The power module 215 is connected to a 48 volt power source (not shown) that is provided by the tester 100. It functions as a DC—DC converter, and distributes DC power to each of the APE modules 210. FIG. 3 illustrates a section 310 in the power module 215 that supplies power to the APE module 210-1. As shown, the APE module 210-1 is powered by a set of five power supplies in the power module 215, each supplying a voltage of a different level, and has an analog ground (GND). The power module 215 has three other sections that supply power to the three APE modules 210-2, 210-3, 210-4, respectively, in the same manner. Power is supplied to other components of the analog instrument (except for the system monitoring FPGA 290 and its related circuitry, which is powered through a different power module (not shown) that is connected to the 48 V power supply of the tester 100), but for simplicity is not illustrated.

Figure 4:
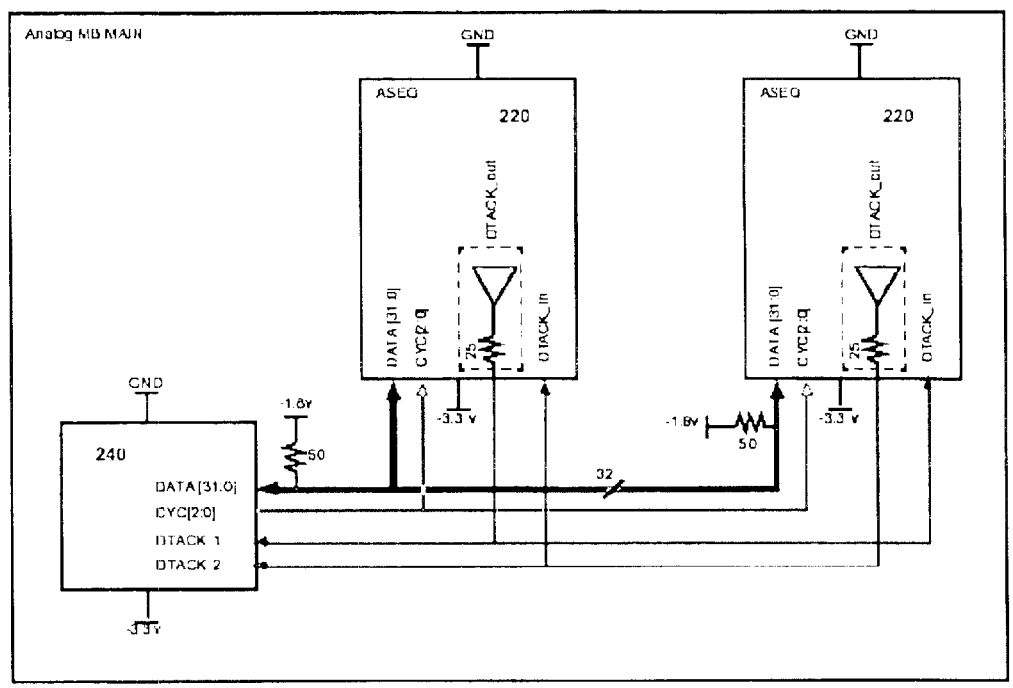
FIG. 4 illustrates an internal bus between a bus interface and a pair of programmable devices.

An internal bus connecting the bus interface FPGA 240 and the two FPGAs 220 is illustrated in FIG. 4. This bus carries 37 signals, including: 32 bidirectional data lines; 3 bits for cycle type information (e.g., READ cycle, WRITE cycle, resource cycle, or function cycle); and two DTACK signals, one coming out of each of the FPGAs 220. The DTACK signals are used during read cycles to indicate that read data are already present on the bus (DTACK=1) or that expected read data are not available yet (DTACK=0). This mechanism allows one of the FPGAs 220 to wait before fetching data, when the other of the FPGAs 220 does not have the current expected data ready on the bus. DTACK is also used during the write cycle. If for some reason, one of the FPGAs 220 cannot process the data present on the bus, it would raise the DTACK signal to indicate to the bus interface FPGA 240 to hold the data on the bus.

Figure 5:
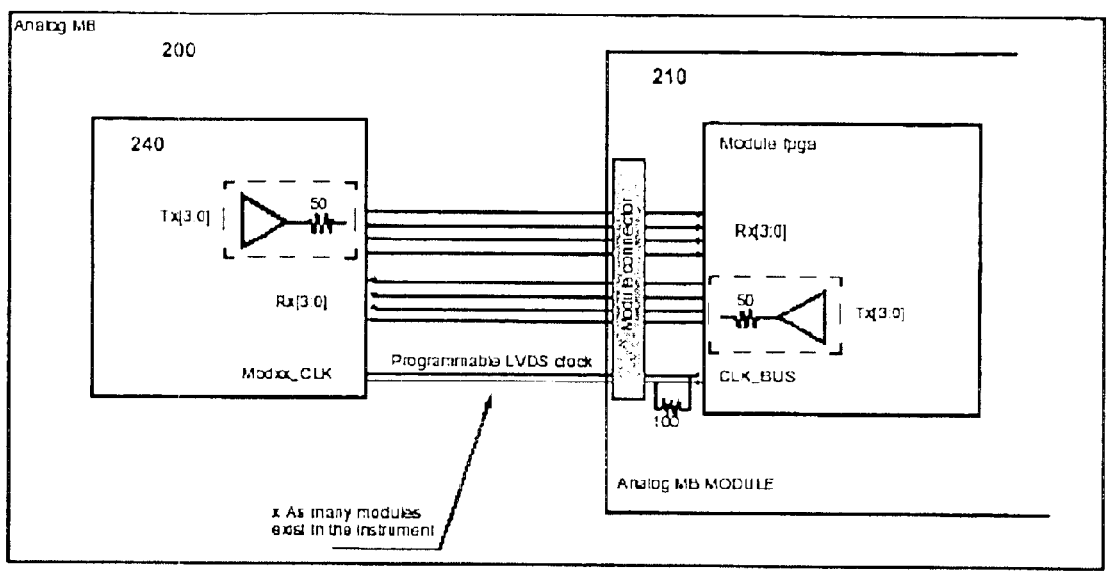
FIG. 5 illustrates an internal bus between a bus interface and a system monitoring device.

An internal bus connecting the bus interface FPGA 240 and one of the four APE modules 210 is illustrated in FIG. 5. The other three APE modules 210 are connected to the bus interface FPGA 240 over separate buses in a similar manner. The aim of the link between the bus interface FPGA 240 and the APE modules 210 (and the PMU 270 and the TMU 280) is to provide a simple, easy-to-implement means of communication with modest performance. This link consists of 8 point-to-point source terminated lines, 4 of them are used to transmit and the other 4 are used to receive. In addition, the clock for the bus is generated by the bus interface FPGA 240 and sent individually to each APE module 210. The frequency of these bus clocks is individually programmable via a register, and it ranges from 12.5 MHz to 100 MHz.

A certain amount of information is shared between the bus interface FPGA 240 and the system monitoring FPGA 290. A two-wire interface is used for this communication link.

Referring to FIG. 2, the FPGAs 220 store waveform data (WDATA) in the memories 225 and send them to the APE modules 210. The waveform data is used by the APE modules 210 to generate the test signals that are supplied to the analog pins of the DUT 190. The APE modules 210 receive response signals from the analog pins of the DUT 190 and supply them back to the FPGAs 220. The waveform data corresponding to the response signals is also stored in the memories 225.

Each APE module 210 is connected to an associated one of the FPGAs 220 to support 18 differential pairs in each direction. The transfer rate ranges up to 400 MHz on the source side and 105 MHz on the measure side. Transmit and receive clock is associated with the data. Each FPGA 220 supports two APE modules 210.

In addition, the two FPGAs 220 supply the clock to the four APE modules 210 through four digital clock generators 230. Each of the APE modules 210 generates test signals based on the received waveform data (WDATA) upon receipt of the clock from an associated one of the FPGAs 220 through one of the digital clock generators 230. The FPGAs 220 supply data and clock to the APE modules 210 upon receipt of a triggering signal from the bus interface FPGA 240.

The digital clock generators 230 generate the digital clock used by the APE modules 210 and are under the control of the FPGAs 220. The digital clock that is output from each of the digital clock generators 230 is multiplexed with a low-jitter, high frequency resolution analog clock (A Clk) before it is supplied to the corresponding APE module 210.

Each of the APE modules 210 is connected to a corresponding FPGA 220 through a dedicated connection for the waveform data and a dedicated connection for its clock. With this structure and the programmability of the FPGAs 220, the waveform data and clock signals can be selected and supplied to each of the APE modules 210 independently from one another. As a result, depending on the application, the test signals generated by the APE modules 210 may have the same or different timings. Similarly, since the waveform data for each of the APE modules 210 is selected by the FPGAs 220, the waveform of the test signals generated by the APE modules 210 may be the same or different.

The bus interface FPGA 240 is connected to the system bus (only partly shown) of the tester 100. It receives instructions generated by the test program 150 over the system bus, and returns test results over the system bus. The bus interface FPGA 240 also generates the clocks used by the field programmable gate arrays that are part of the APE modules 210. Depending on the application, the bus interface FPGA 240 may be programmed such that the clocks distributed to the field programmable gate arrays of the four APE modules 210 may be any one of 12.5, 25, 50 or 100 MHz. The bus interface FPGA 240 also communicates with other instruments 110, 120, 130 of the tester 100 via the system bus.

The clock divider 250 is connected to the master clock 136 of the tester 100. In the preferred embodiment, the clock divider 250 receives a 400 MHz clock from the master clock 136, and distributes a 200 MHz clock for the FPGAs 220 and the bus interface FPGA 240 and a 100 MHz clock for internal bus communication between the FPGAs 220 and the bus interface FPGA 240.

To assure that the 200 MHz clock used by the bus interface FPGA 240 is perfectly aligned with the other instruments 110, 120, 130, a reset signal that is supplied to all the instruments 100, 120, 130 is generated by the tester 100. FIG. 6A illustrates the reset signal that is generated by the tester 100, and FIG. 6B is a block diagram of the circuit that generates the reset signal of FIG. 6A.

The reset signal shown in FIG. 6A is encoded by means of a missing clock cycle. It is generated from the master clock 136. Using a delayed signal 420 and a simple flip-flop 430, this missing clock cycle can be detected and used to generate a reset pulse 435 for the clock divider 250 and the clock dividers used in the other instruments. This reset process is executed during the setup phase, before running or loading any test program.

The analog clock 260 is used to provide a low jitter (<1 picosecond) clock with very high frequency resolution (0.1 Hz). The analog clock 260 is used in certain applications carried out by the APE modules 210 that require high performance, and is used by the TMU 280 for accurate timing calibration.

The PMU 270 is used to calibrate the APE modules 210 for accurate DC parametric measurements (such as voltage or current) of the response signals from the analog pins of the DUT 190. The TMU 280 is used to calibrate the instrument for accurate timing measurements and provide accurate timing information to the APE modules 210. The digital clock signals coming from the digital clock generators 230 are multiplexed with the analog clock and supplied to the TMU 280 to enable accurate timing calibration.

The system monitoring FPGA 290 and the EEPROM 295 manage the system monitoring functions, including: monitoring of temperature faults, DC faults, clock faults, and bus faults; sequencing of the power module 215; and reading and writing identification information of the APE modules 210, instrument type, and slot identification. Commercially available versions of the system monitoring FGPA 290 may include: Xilinx's XC2S50-5 FG256 and Altera's Max7000.

The system monitoring FPGA 290 is clocked by an external oscillator at a relatively low frequency (e.g., 20 MHz), and receives DC_OK (signifying that there are no DC faults) and TEMP_OK (signifying that there are no temperature faults) signals, and other fault signals from the various components in the analog instrument, including the power module 215 and each of the APE modules 210.

The system monitoring FPGA 290 is configured when the analog instrument is plugged into a slot of the tester 100 and 48 V power is present, prior to the power up of the analog instrument in which the system monitoring FPGA 290 is mounted. This is possible because the system monitoring FPGA 290 and its related circuitry are powered from an independent power module (not shown) that is connected to the 48 V power source of the tester 100.

Figure 7:
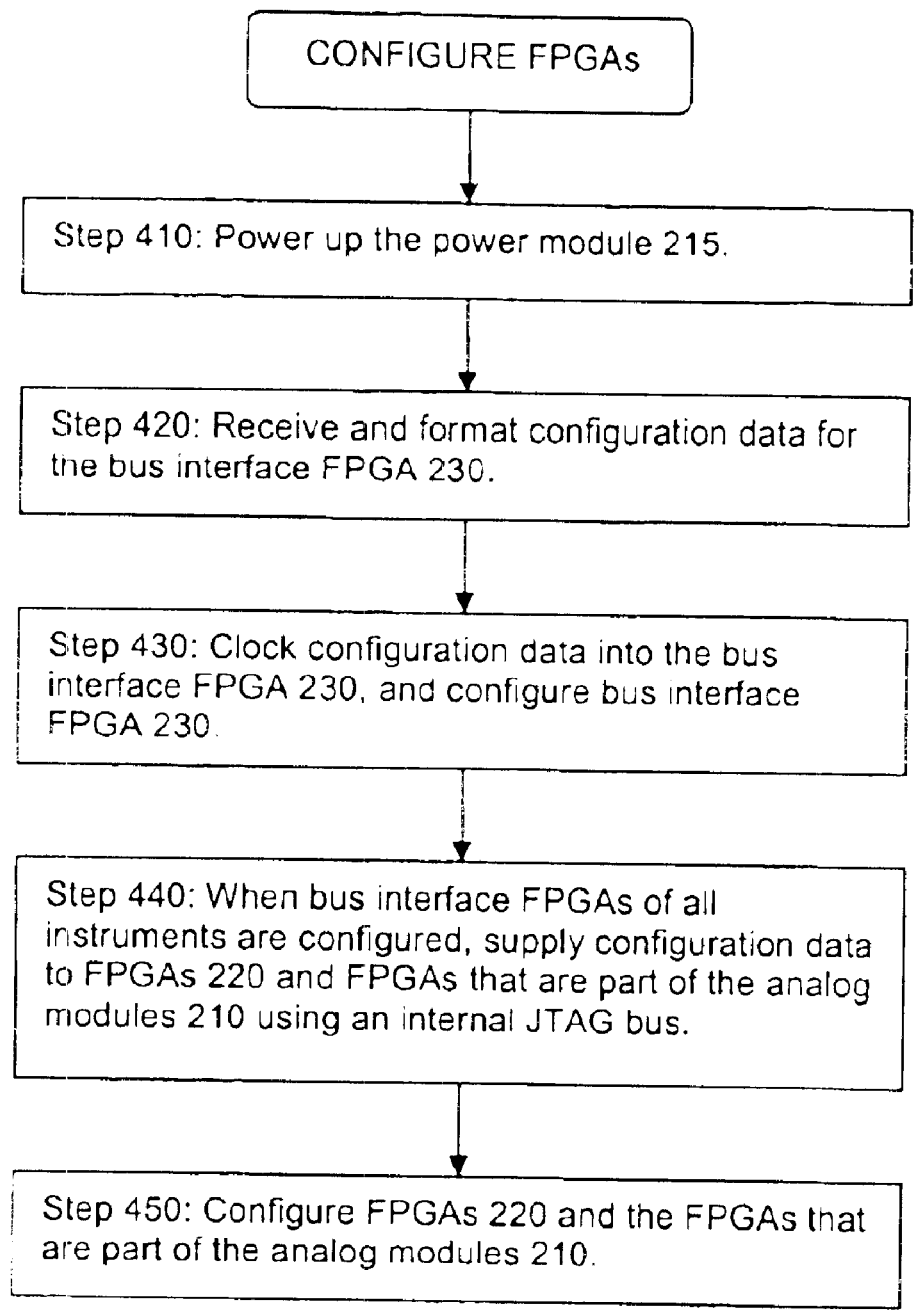
FIG. 7 is a flow diagram showing the configuration process of the analog instrument of FIG. 2.

FIG. 7 is a flow diagram that illustrates the process by which the analog instrument shown in FIG. 2 is configured. In Step 410, power is supplied to the power module 215. The configuration data for the bus interface FPGA 230 then arrives through the system monitoring FPGA 290, and the system monitoring FPGA 290 formats such data (Step 420) and clocks them into the bus interface FPGA 230, pursuant to which the bus interface FPGA 230 is configured (Step 430). When the system monitoring FPGA 290 is selected as Xilinx's XC2S50-5 FG256, the configuration of the bus interface FPGA 230 is performed using Xilinx's "slave serial" configuration mode.

The configuration data for the rest of the FPGAs in the analog instrument arrives on the system bus through the bus interface 230, once all of the bus interface FPGAs of all plugged-in instruments are configured, and transmitted to the appropriate FPGA using an internal JTAG bus (Step 440). In Step 450, the rest of the FPGAs in the analog instrument, including the FPGAs 220 and the FPGAs that are part of the APE modules 210, are configured using the configuration data transmitted over the internal JTAG bus.

While the foregoing is directed to embodiments of the present invention, other and further embodiments of the invention may be devised without departing from the basic scope thereof, and the scope thereof is determined by the claims that follow.

What is claimed is:

1. An analog test instrument used in an apparatus for testing electronic devices, comprising:
    a motherboard including sections for at least two analog modules, a power module for supplying power to the analog modules, and a programmable device for supplying data signals to the analog modules;
    a first analog module positioned in one of said sections for generating a test signal to be supplied to an analog pin of a device under test upon receipt of data signals from the programmable device and a first clock signal; and
    a second analog module positioned in another one of said sections for generating a test signal to be supplied to another analog pin of the device under test upon receipt of data signals from the programmable device and a second clock signal,
    wherein the clock signals are supplied to the first and second analog modules under control of the programmable device.

2. The analog test instrument according to claim 1, wherein the motherboard further includes a first digital clock generator for producing the first clock signal and a second digital clock generator for producing the second clock signal.

3. The analog test instrument according to claim 2, wherein the motherboard further includes an analog clock generator for producing an analog clock that is also supplied to the first and second analog modules.

4. The analog test instrument according to claim 1, further comprising a bus interface programmable device that is synchronized with other instruments of said apparatus, wherein said programmable device supplies data signals to the first and second analog modules and controls the timing of the first and second clock signals supplied to the first and second analog modules, respectively, under the control of the bus interface programmable device.

5. The analog test instrument according to claim 1, further comprising:

a third analog module positioned in a third one of said sections for generating a test signal to be supplied to a third analog pin of a device under test upon receipt of data signals from the programmable device and a third clock signal; and a fourth analog module positioned in a fourth one of said sections for generating a test signal to be supplied to a fourth analog pin of the device under test upon receipt of data signals from the programmable device and a fourth clock signal, wherein said motherboard includes another programmable device for supplying data signals to the third and fourth analog modules, and the clock signals are supplied to the third and fourth analog modules under control of said another programmable device.

6. The analog test instrument according to claim 1, wherein the first and second analog modules comprise different circuitry.

7. The analog test instrument according to claim 1, wherein the power module is connected separately to the first and second analog modules to supply power to the first and second analog modules independently from one another.

8. A motherboard for an analog test instrument used in an apparatus for testing electronic devices, comprising:

at least two sections on each of which an analog module is to be mounted;

a power module for supplying power to the analog modules to be mounted;

a programmable device for supplying data signals to the analog modules to be mounted and for controlling clock signals supplied to the analog modules to be mounted; and a time measurement unit for performing timing calibration on the analog modules to be mounted.

9. The motherboard according to claim 8, further comprising a parametric measurement unit for performing voltage calibration on the analog modules to be mounted.

10. The motherboard according to claim 9, further comprising an analog clock that the time measurement unit uses for the timing calibration.

11. The motherboard according to claim 8, further comprising another programmable device, wherein said programmable device supplies data signals to the analog modules to be mounted under the control of said another programmable device.

12. The motherboard according to claim 11, further comprising a clock divider connected to a main clock of said apparatus for testing electronic devices, wherein the clock divider distributes clock signals to said programmable device, said another programmable device, and said time measurement unit.

13. The motherboard according to claim 8, further comprising first and second power supply lines for supplying power from the power module to first and second ones of the analog modules to be mounted, respectively.

14. An apparatus for testing electronic devices, comprising:

a device power supply for supplying power to a device under test;

digital instruments for supplying test signals to digital pins of the device under test; and at least one analog instrument for supplying test signals to analog pins of the device under test, wherein said analog instrument includes first and second analog modules for generating the test signals for said analog pins of the device under test and a programmable device that is synchronized with, and connected over a system bus to, the digital instruments and any other analog instruments, and wherein said programmable device controls the supply of data signals and clock signals to the analog modules in response to test instructions received over the system bus.

15. The apparatus according to claim 14, wherein the analog test instrument further includes a second programmable device for selecting and supplying waveform data to be supplied to the first and second analog modules.

16. The apparatus according to claim 15, wherein the analog test instrument further includes a first digital clock generator for producing a first clock signal, in response to which the first analog module generates test signals for a first one of said analog pins, and a second digital clock generator for producing a second clock signal, in response to which the second analog module generates test signals for a second one of said analog pins.

17. The apparatus according to claim 16, wherein the first and second digital clock generators are under the control of said second programmable device.

18. The apparatus according to claim 17, wherein the first and second clock signals are at different speeds.

19. The apparatus according to claim 14, wherein the first and second analog modules comprises different circuitry.

20. The apparatus according to claim 14, wherein the analog test instrument further includes a power module that distributes power to the first and second analog modules independently from one another.

* * * * *